US012794447B2

(12) United States Patent
Goto et al.

(10) Patent No.: US 12,794,447 B2
(45) Date of Patent: Nov. 10, 2026

(54) RADIO FREQUENCY ACOUSTIC DEVICES AND METHODS WITH INTERDIGITAL TRANSDUCER FORMED IN MULTILAYER PIEZOELECTRIC SUBSTRATE

(71) Applicant: Skyworks Solutions, Inc., Irvine, CA (US)

(72) Inventors: Rei Goto, Osaka (JP); Hironori Fukuhara, Ibaraki (JP); Shoji Okamoto, Hirakata (JP)

(73) Assignee: Skyworks Solutions, Inc., Irvine, CA (US)

( * ) Notice: Subject to any disclaimer, the term of this patent is extended or adjusted under 35 U.S.C. 154(b) by 129 days.

(21) Appl. No.: 18/229,590

(22) Filed: Aug. 2, 2023

(65) Prior Publication Data

US 2024/0048125 A1 Feb. 8, 2024

Related U.S. Application Data

(60) Provisional application No. 63/394,813, filed on Aug. 3, 2022.

(51) Int. Cl.

| | |
|---|---|
| ***H03H 9/64*** | (2006.01) |
| ***H03H 3/04*** | (2006.01) |
| ***H03H 9/02*** | (2006.01) |
| ***H03H 9/25*** | (2006.01) |

(52) U.S. Cl.

CPC ............ *H03H 9/6453* (2013.01); *H03H 3/04* (2013.01); *H03H 9/02559* (2013.01); *H03H 9/25* (2013.01)

(58) Field of Classification Search

CPC ..... H03H 9/6453; H03H 9/02559; H03H 9/25

See application file for complete search history.

(56) References Cited

U.S. PATENT DOCUMENTS

| | | | |
|---|---|---|---|
| 6,268,680 | B1 | 7/2001 | Rooth |
| 6,642,813 | B1 | 11/2003 | Itakura et al. |
| 6,848,295 | B2 | 2/2005 | Auner et al. |
| 7,322,243 | B2 | 1/2008 | Liu et al. |
| 8,143,681 | B2 | 3/2012 | Zaghloul et al. |
| 8,427,032 | B2 | 4/2013 | Nishiyama et al. |
| 8,436,509 | B1 | 5/2013 | Branch |
| 9,160,299 | B2 | 10/2015 | Goto et al. |

(Continued)

FOREIGN PATENT DOCUMENTS

| | | |
|---|---|---|
| JP | H07236382 A | 10/1995 |
| JP | 2013-214789 A | 10/2013 |

(Continued)

OTHER PUBLICATIONS

Kimura et al., "High Q SAW Resonator Using upper-electrodes on Grooved-electrodes in LiTaO3," IEEE MTT-S, International Microwave Symposium digest, Jun. 2020, pp. 1740-1743.

(Continued)

*Primary Examiner* — Samuel S Outten

(74) *Attorney, Agent, or Firm* — VIA LLP

(57) ABSTRACT

A radio frequency acoustic filter includes a plurality of resonators arranged to filter a signal. At least one resonator of the plurality of resonators includes a support substrate, a functional layer, and a piezoelectric layer. Both the piezoelectric layer and the functional layer are supported by the support substrate. An interdigital transducer structure is at least partially formed in the piezoelectric layer.

20 Claims, 12 Drawing Sheets

(56) References Cited

U.S. PATENT DOCUMENTS

| | | | | |
|---|---|---|---|---|
| 9,257,960 | B2 | 2/2016 | Ruile et al. | |
| 9,673,779 | B2 | 6/2017 | Ruile et al. | |
| 9,906,206 | B2 | 2/2018 | Shih et al. | |
| 11,082,029 | B2 | 8/2021 | Kodama et al. | |
| 2006/0032312 | A1 | 2/2006 | Auner et al. | |
| 2011/0133600 | A1 | 6/2011 | Kimura et al. | |
| 2012/0133246 | A1* | 5/2012 | Yaoi | H03H 9/131 310/313 C |
| 2013/0300253 | A1 | 11/2013 | Kimura et al. | |
| 2014/0266511 | A1* | 9/2014 | Turner | G06F 30/327 716/104 |
| 2015/0318838 | A1* | 11/2015 | Bhattacharjee | H03H 9/02228 310/321 |
| 2017/0155373 | A1 | 6/2017 | Ruby et al. | |
| 2019/0097602 | A1* | 3/2019 | Kimura | H03H 9/02228 |
| 2019/0334500 | A1 | 10/2019 | Horikawa | |
| 2020/0119710 | A1 | 4/2020 | Kadota et al. | |
| 2020/0212876 | A1 | 7/2020 | Goto et al. | |
| 2020/0328728 | A1 | 10/2020 | Nakagawa et al. | |
| 2022/0200566 | A1 | 6/2022 | Kadota et al. | |
| 2024/0178812 | A1 | 5/2024 | Goto et al. | |
| 2024/0178814 | A1 | 5/2024 | Goto et al. | |

FOREIGN PATENT DOCUMENTS

| | | | |
|---|---|---|---|
| WO | 2001-028090 | A1 | 4/2001 |
| WO | 2010-016192 | A1 | 11/2010 |
| WO | 2011-007690 | A1 | 1/2011 |
| WO | 2012-086441 | A1 | 6/2012 |
| WO | WO2014/054580 | A1 | 4/2014 |

OTHER PUBLICATIONS

International Search Report for International Application No. PCT/JP2020/014906, dated Jun. 23, 2020.

Translation of the International Search Report for International Application No. PCT/JP2020/014906, dated Jun. 23, 2020.

Written Opinion of the International Searching Authority for International Application No. PCT/JP2020/014906, dated Jun. 23, 2020.

* cited by examiner

RADIO FREQUENCY ACOUSTIC DEVICES AND METHODS WITH INTERDIGITAL TRANSDUCER FORMED IN MULTILAYER PIEZOELECTRIC SUBSTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of this disclosure relate to multilayer piezoelectric substrate (MPS) devices, and in particular to MPS for acoustic wave devices with an embedded interdigital transducer (IDT) structure.

Description of the Related Technology

An acoustic wave device can include a plurality of resonators arranged to filter a radio frequency signal. Example acoustic wave resonators include SAW resonators and bulk acoustic wave (BAW) resonators. A surface acoustic wave resonator can include an interdigital transducer (IDT) electrode on a piezoelectric substrate. The surface acoustic wave resonator can generate a surface acoustic wave on a surface of the piezoelectric layer on which the interdigital transducer electrode is disposed. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Multilayer piezoelectric substrate (MPS) packaging methods are developing to provide for high Q, high coupling coefficient $$k_{eff}^2,$$

small temperature coefficient of frequency (TCF) and high power durability filter solutions. A consolidated packaging method is required for mass production.

SUMMARY

In some aspects, the techniques described herein relate to a surface acoustic wave filter package including: a piezoelectric layer; and an interdigital transducer structure at least partially embedded or formed in the piezoelectric layer.

In some aspects, the techniques described herein relate to a surface acoustic wave filter package wherein the interdigital transducer structure includes a layer of molybdenum (Mo).

In some aspects, the techniques described herein relate to a surface acoustic wave filter package wherein the interdigital transducer structure includes a layer of aluminum (Al).

In some aspects, the techniques described herein relate to a surface acoustic wave filter package wherein the layer of Mo has a height in the range between 0.02 and 0.08, where λ is a wavelength along an interdigital transducer propagation direction of a main mode.

In some aspects, the techniques described herein relate to a surface acoustic wave filter package wherein the layer of Al has a height in the range between 0.04 and 0.08, where λ is a wavelength along an interdigital transducer propagation direction of a main mode.

In some aspects, the techniques described herein relate to a surface acoustic wave filter package wherein the interdigital transducer structure has an embedment depth in the range between 0.01 and 0.10, where λ is a wavelength along an interdigital transducer propagation direction of a main mode.

In some aspects, the techniques described herein relate to a surface acoustic wave filter package wherein the piezoelectric layer includes lithium tantalate (LiTaO3, LT) or consists thereof.

In some aspects, the techniques described herein relate to a surface acoustic wave filter package wherein the piezoelectric layer has a LT cut angle for XY-LiTaO3, where is equal or larger than approximately 20° and 360° is a full rotation.

In some aspects, the techniques described herein relate to a surface acoustic wave filter package wherein the interdigital transducer structure includes a layer of copper (Cu).

In some aspects, the techniques described herein relate to a surface acoustic wave filter package further including a piezoelectric layer capping the interdigital transducer structure.

In some aspects, the techniques described herein relate to a surface acoustic wave filter package wherein the interdigital transducer structure is fully embedded or formed in the piezoelectric layer.

In some aspects, the techniques described herein relate to a surface acoustic wave filter package wherein the interdigital transducer structure has a reverse tapered shape.

In some aspects, the techniques described herein relate to a surface acoustic wave filter package wherein the interdigital transducer structure includes a layer of copper (Cu), platinum (Pt), or gold (Au).

In some aspects, the techniques described herein relate to a surface acoustic wave filter package further including a second piezoelectric layer capping the interdigital transducer structure.

In some aspects, the techniques described herein relate to a surface acoustic wave filter package wherein the interdigital transducer structure is fully embedded or formed in the piezoelectric layer.

In some aspects, the techniques described herein relate to a surface acoustic wave filter package including a substrate; a cavity formed in or above the substrate; and one or more surface acoustic wave filters formed on the substrate, the one or more surface acoustic wave filters including the interdigital transducer structure embedded or formed in the piezoelectric layer.

In some aspects, the techniques described herein relate to a surface acoustic wave filter package wherein the substrate includes a silicon (Si) substrate.

In some aspects, the techniques described herein relate to a surface acoustic wave filter package wherein the one or more surface acoustic wave filters includes a piezoelectric layer and a functional layer.

In some aspects, the techniques described herein relate to a method of forming a surface acoustic wave filter package including: forming a substrate; forming a functional layer on the substrate; forming a piezoelectric layer on the functional layer; and forming an interdigital transducer structure at least partially embedded or formed in the piezoelectric layer.

In some aspects, the techniques described herein relate to a method wherein the interdigital transducer structure includes a layer of molybdenum (Mo).

In some aspects, the techniques described herein relate to a method wherein the interdigital transducer structure includes a layer of aluminum (Al).

In some aspects, the techniques described herein relate to a method wherein the layer of Mo has a height in the range between 0.02 and 0.08, where λ is a wavelength along an interdigital transducer propagation direction of a main mode.

In some aspects, the techniques described herein relate to a method wherein the layer of Al has a height in the range between 0.04 and 0.08, where λ is a wavelength along an interdigital transducer propagation direction of a main mode.

In some aspects, the techniques described herein relate to a method wherein the interdigital transducer structure has an embedment depth in the range between 0.01 and 0.10, where λ is a wavelength along an interdigital transducer propagation direction of a main mode.

In some aspects, the techniques described herein relate to a method wherein the piezoelectric layer includes lithium tantalate ($LiTaO_3$, LT) or consists thereof.

In some aspects, the techniques described herein relate to a method wherein the piezoelectric layer has a XY cut angle equal or larger than approximately 20°, where 360° is a full rotation.

In some aspects, the techniques described herein relate to a method wherein the interdigital transducer structure includes a layer of copper (Cu).

In some aspects, the techniques described herein relate to a method further including a piezoelectric layer capping the interdigital transducer structure.

In some aspects, the techniques described herein relate to a method wherein the interdigital transducer structure is fully embedded or formed in the piezoelectric layer.

In some aspects, the techniques described herein relate to a method wherein the interdigital transducer structure has a reverse tapered shape.

In some aspects, the techniques described herein relate to a method wherein the interdigital transducer structure includes a layer of copper (Cu), platinum (Pt), or gold (Au).

In some aspects, the techniques described herein relate to a method further including a second piezoelectric layer capping the interdigital transducer structure.

In some aspects, the techniques described herein relate to a method wherein the interdigital transducer structure is fully embedded or formed in the piezoelectric layer.

In some aspects, the techniques described herein relate to a method wherein the substrate includes a silicon (Si) substrate.

In some aspects, the techniques described herein relate to a multiplexer including: a surface acoustic wave filter package, the surface acoustic wave filter package including a piezoelectric layer, and an interdigital transducer structure at least partially embedded or formed in the piezoelectric layer.

In some aspects, the techniques described herein relate to an acoustic filter configured to filter a radiofrequency signal, the acoustic filter including: an input terminal configured to receive a radio frequency signal; an output terminal; a plurality of resonators between the input terminal and the output terminal, the plurality of resonators arranged to filter the radio frequency signal; and at least one resonator of the plurality of resonators including a support substrate, a functional layer, and a piezoelectric layer, both the piezoelectric layer and the functional layer supported by the support substrate, and a multi-layer interdigital transducer structure at least partially formed in the piezoelectric layer.

In some aspects, the techniques described herein relate to an acoustic filter wherein the multi-layer interdigital transducer structure has an embedment depth in a range between 0.01 and 0.10, where λ is a wavelength along an interdigital transducer propagation direction of a main mode.

In some aspects, the techniques described herein relate to an acoustic filter wherein the piezoelectric layer includes lithium tantalate ($LiTaO_3$, LT) with a LT cut angle for XY-$LiTaO_3$, where is equal or larger than approximately 20° and 360° is a full rotation.

In some aspects, the techniques described herein relate to an acoustic filter wherein the multi-layer interdigital transducer structure includes a first layer of molybdenum (Mo) has a height in a range between 0.02 and 0.08, where λ is a wavelength along an interdigital transducer propagation direction of a main mode.

In some aspects, the techniques described herein relate to an acoustic filter wherein the multi-layer interdigital transducer structure includes a second layer of aluminum (Al) has a height in a range between 0.04 and 0.08, where λ is a wavelength along an interdigital transducer propagation direction of a main mode.

In some aspects, the techniques described herein relate to an acoustic filter further including a second piezoelectric layer capping the multi-layer interdigital transducer structure.

In some aspects, the techniques described herein relate to an acoustic filter wherein the multi-layer interdigital transducer structure has a reverse tapered shape.

In some aspects, the techniques described herein relate to a mobile device including an antenna and a radio frequency front end module, the radio frequency front end module including the acoustic filter.

In some aspects, the techniques described herein relate to an acoustic wave device including: a support substrate; a piezoelectric layer supported by the support substrate; and a multi-layer interdigital transducer structure at least partially formed in the piezoelectric layer, wherein the interdigital transducer structure has an embedment depth in a range between 0.01 and 0.10, where λ is a wavelength along an interdigital transducer propagation direction of a main mode.

In some aspects, the techniques described herein relate to an acoustic wave device wherein the piezoelectric layer includes lithium tantalate ($LiTaO_3$, LT) with a LT cut angle for XY-$LiTaO_3$, where is equal or larger than approximately 20° and 360° is a full rotation.

In some aspects, the techniques described herein relate to an acoustic wave device wherein the interdigital transducer structure is a multi-layer interdigital transducer including a first layer of molybdenum (Mo) has a height in a range between 0.02 and 0.08, where λ is a wavelength along an interdigital transducer propagation direction of a main mode.

In some aspects, the techniques described herein relate to an acoustic wave device wherein the multi-layer interdigital transducer structure includes a second layer of aluminum (Al) has a height in a range between 0.04 and 0.08, where λ is a wavelength along an interdigital transducer propagation direction of a main mode.

In some aspects, the techniques described herein relate to an acoustic wave device further including a second piezoelectric layer capping the interdigital transducer structure.

In some aspects, the techniques described herein relate to an acoustic wave device wherein the interdigital transducer structure has a reverse tapered shape.

In some aspects, the techniques described herein relate to a method of forming an acoustic wave device including: forming a substrate; forming a functional layer on the substrate; forming a piezoelectric layer on the functional layer; and forming a multi-layer interdigital transducer structure at least partially in the piezoelectric layer.

In some aspects, the techniques described herein relate to a method wherein the multi-layer interdigital transducer structure has an embedment depth in a range between 0.01 and 0.10, where λ is a wavelength along an interdigital transducer propagation direction of a main mode.

In some aspects, the techniques described herein relate to a method wherein the piezoelectric layer includes lithium tantalate (LiTaO3, LT) with a LT cut angle for XY-LiTaO3, where is equal or larger than approximately 20° and 360° is a full rotation.

In some aspects, the techniques described herein relate to a method wherein the multi-layer interdigital transducer structure includes a first layer of molybdenum (Mo) has a height in a range between 0.02 and 0.08, where λ is a wavelength along an interdigital transducer propagation direction of a main mode.

In some aspects, the techniques described herein relate to a method wherein the multi-layer interdigital transducer structure includes a second layer of aluminum (Al) has a height in a range between 0.04 and 0.08, where λ is a wavelength along an interdigital transducer propagation direction of a main mode.

In some aspects, the techniques described herein relate to a method further including forming a second piezoelectric layer capping the multi-layer interdigital transducer structure.

BRIEF DESCRIPTION OF THE DRAWINGS

FIG. 2A' is an enlarged view of the encircled portion of the IDT shown in FIG. 2A.

FIG. 2B' is an enlarged view of the encircled portion of the IDT shown in FIG. 2B.

FIG. 2C' is an enlarged view of the encircled portion of the IDT shown in FIG. 2C.

Figure 2A:
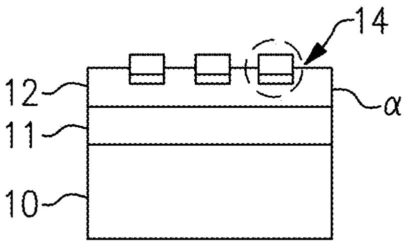
FIG. 2A is a cross sectional view of an IDT structure of a section of a SAW device with a partially embedded IDT structure having two layers of Mo and Al or two layers of Cu and Al.
Figure 2A:
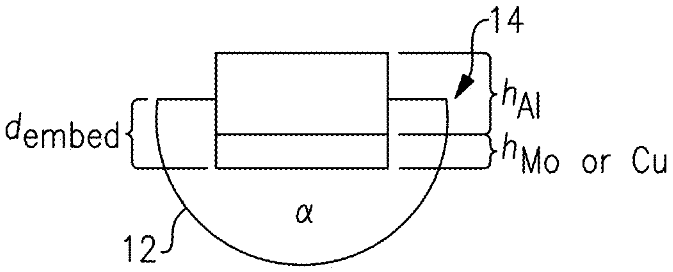

(middle frame), and resonance frequency fs (right frame) versus embedment depth $d_{embed}/\lambda$ for different heights $h_{Mo}$ of a Mo layer in the range $0.02 \leq h_{Mo}/\lambda \leq 0.08$, fixed height $h_{Al}$ of an Al layer at $h_{Al}/\lambda = 0.08$, and fixed LT cut angle for XY-$LiTaO_3$ at 42°, as obtained from a 2D simulation for the IDT structure presented in FIG. 2A and FIG. 2A'.

Figure 3A:
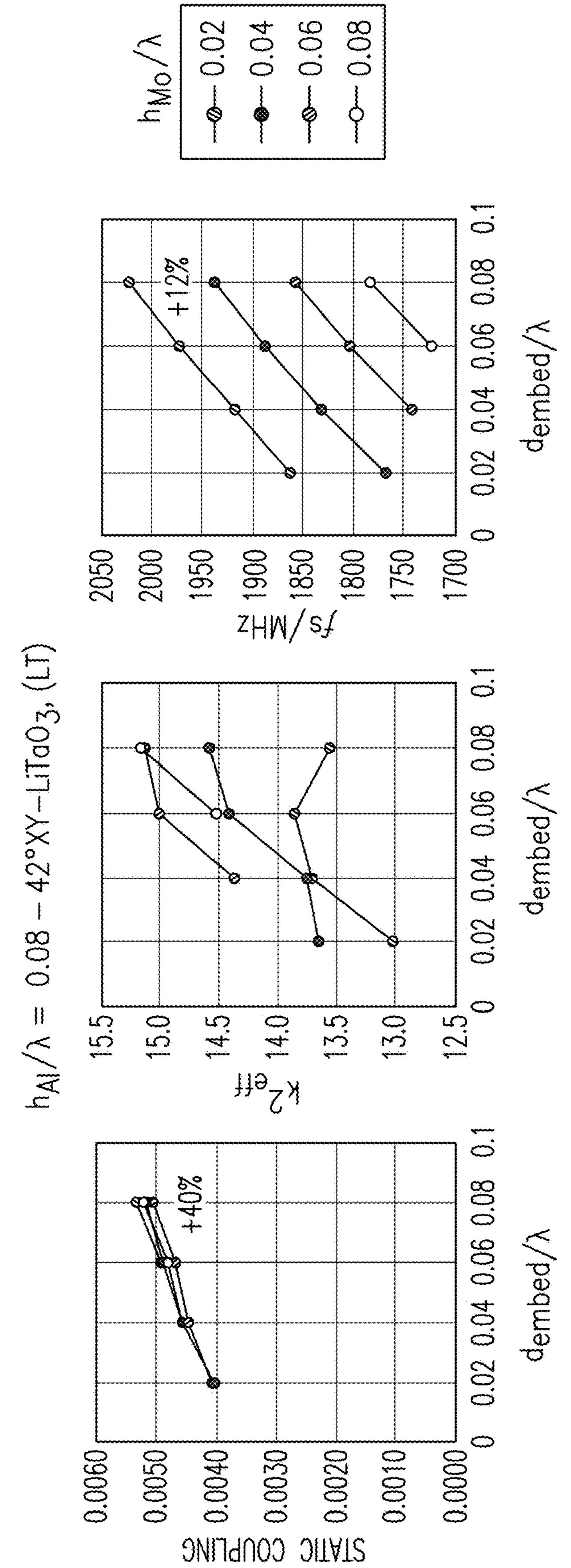
FIG. 3A illustrates three plots of static coupling (left frame), $$k_{eff}^2$$
Figure 3B:
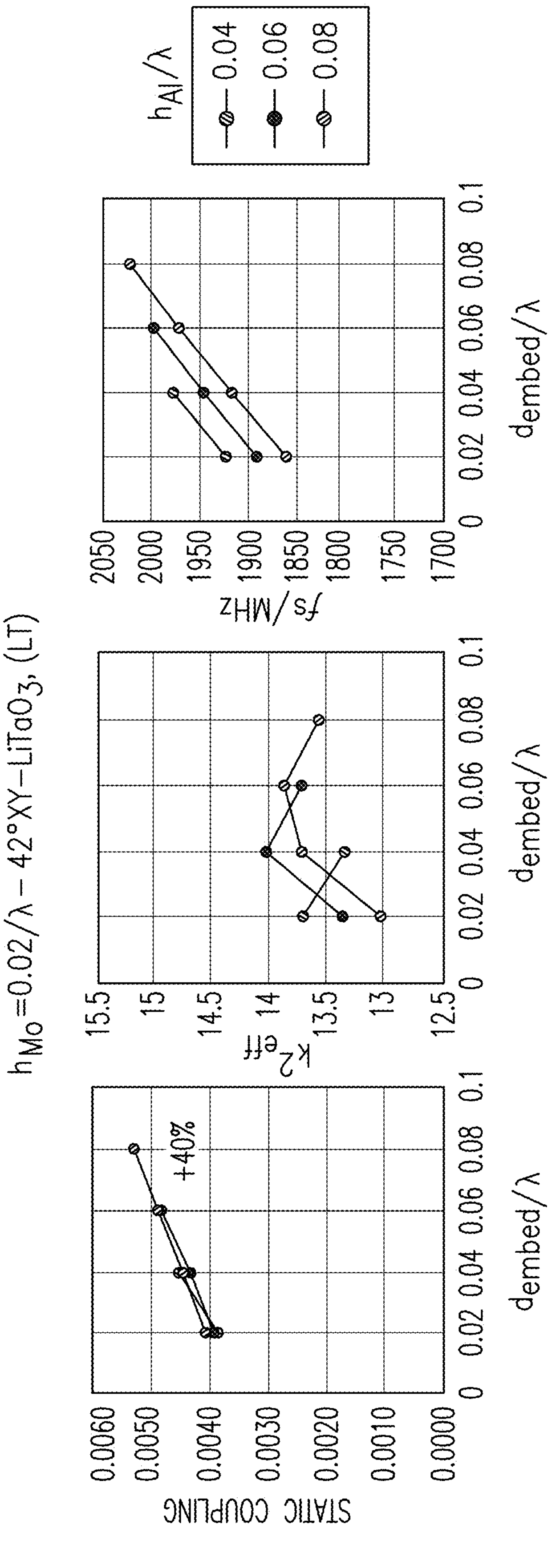

FIG. 3B illustrates three plots of static coupling (left frame), $$k_{eff}^2$$

(middle frame), and resonance frequency fs (right frame) versus embedment depth $d_{embed}/\lambda$ for different heights $h_{Al}$ of an Al layer in the range $0.04 \leq h_{Al}/\lambda \leq 0.08$, a fixed height $h_{Mo}$ of a Mo layer at $h_{Mo}/\lambda = 0.02$, and fixed LT cut angle for XY-$LiTaO_3$ at 42°, as obtained from a 2D simulation for the IDT structure presented in FIG. 2A and FIG. 2A'.

Figure 3C:
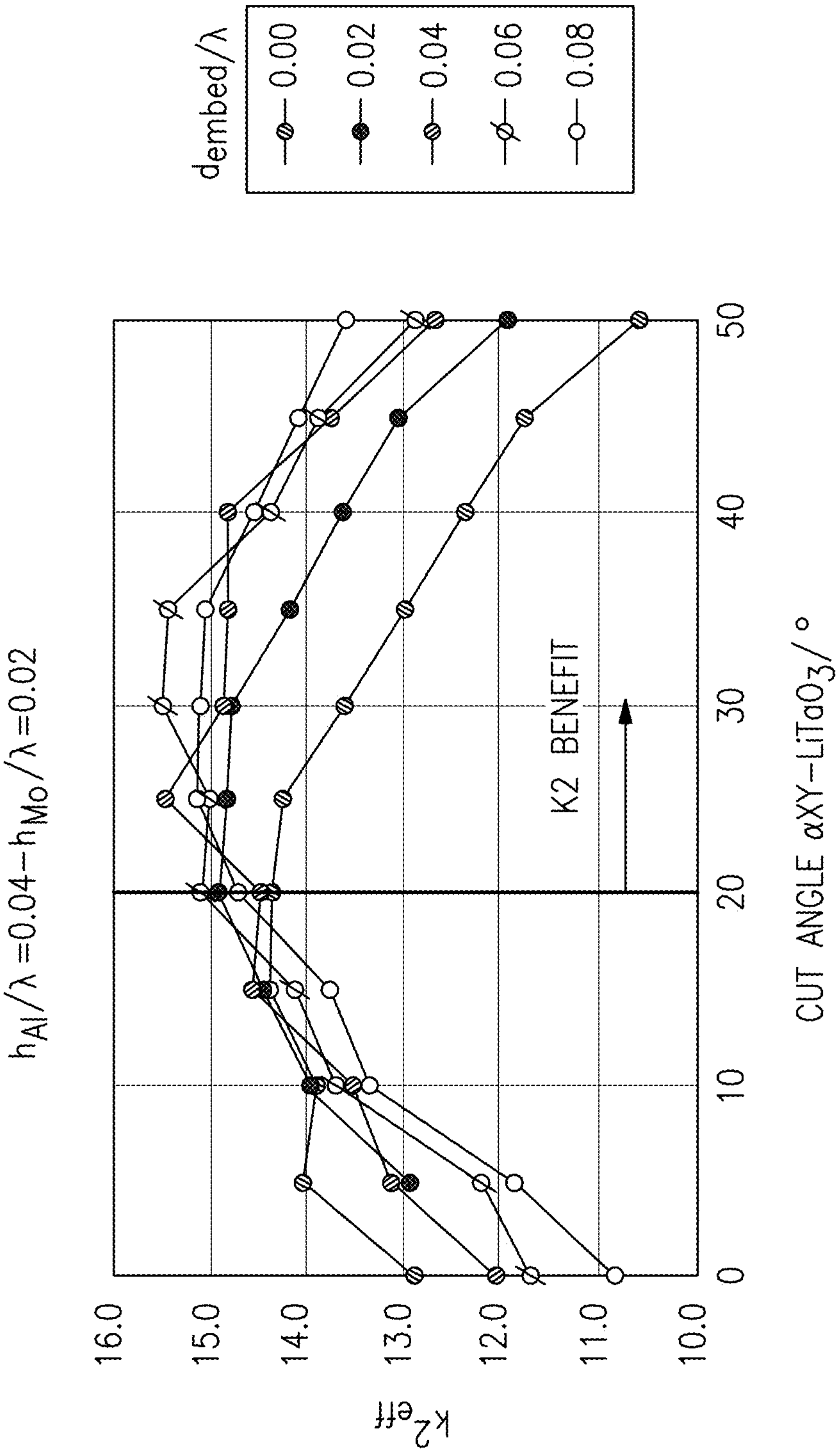

FIG. 3C illustrates a plot of $$k_{eff}^2$$

versus embedment the LT cut angle for XY-$LiTaO_3$ for different embedment depths $d_{embed}/\lambda$, in the range $0.00 \leq d_{embed}/\lambda \leq 0.08$, a fixed height $h_{Mo}$ of a Mo layer at $h_{Mo}/\lambda = 0.02$, and a fixed height $h_{Al}$ of an Al layer at $h_{Mo}/\lambda = 0.04$, as obtained from a 2D simulation for the IDT structure presented in FIG. 2A and FIG. 2A'.

Figures 4A, 4B, 4C:
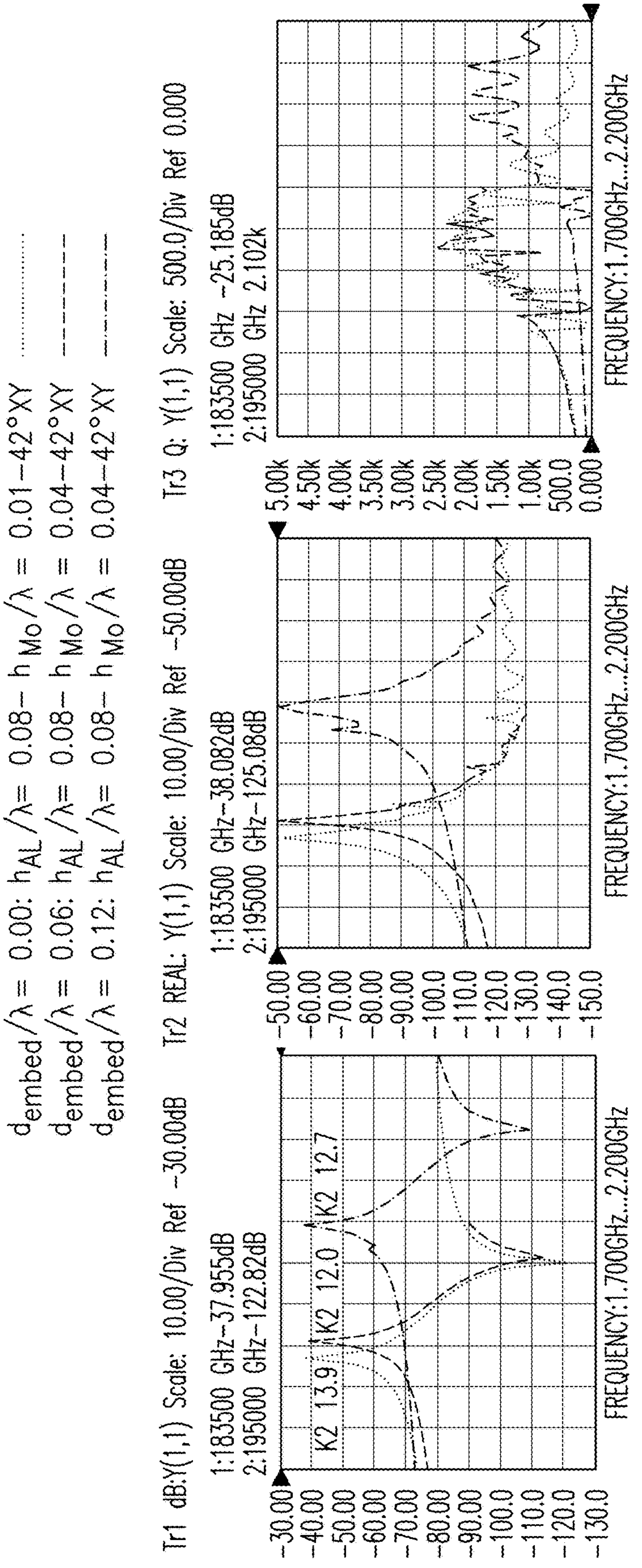

FIG. 4A is a plot of admittance Y(dB) versus frequency f (GHz) for IDT structures with different embedment depths $d_{embed}/\lambda$ as obtained from a 3D simulation for IDT structures in accordance with the structures shown in FIG. 2A and FIG. 2A'.

FIG. 4B is a plot of conduction G(dB) versus frequency f (GHz) for IDT structures with different embedment depths $d_{embed}/\lambda$ as obtained from a 3D simulation for IDT structures in accordance with the structures shown in FIG. 2A and FIG. 2A'.

FIG. 4C is a plot of the Quality factor Q versus frequency f (GHz) for IDT structures with different embedment depths $d_{embed}/\lambda$ as obtained from a 3D simulation for IDT structures in accordance with the structures shown in FIG. 2A and FIG. 2A'.

Figure 5:
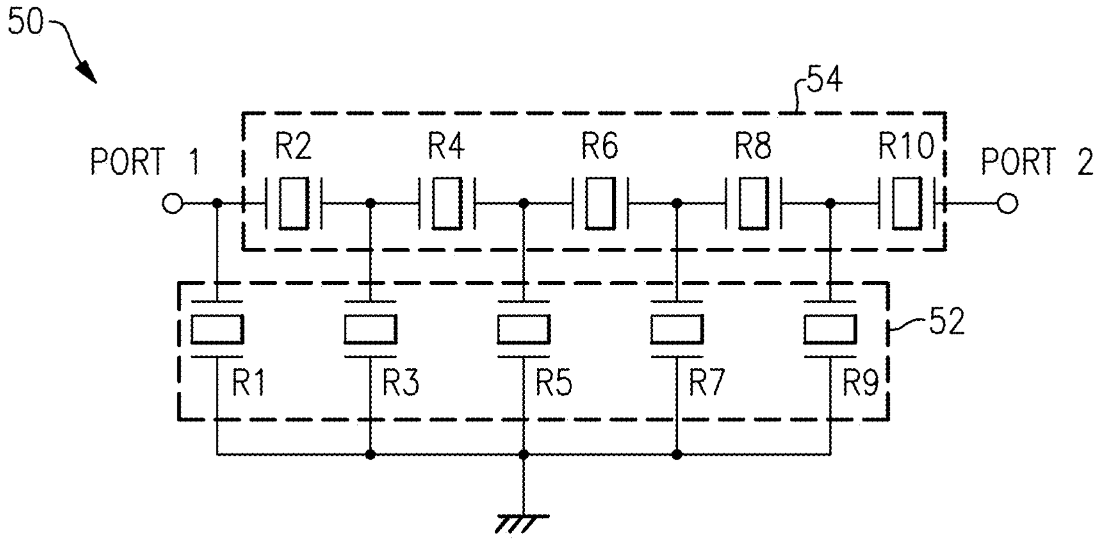

FIG. 5 is a schematic diagram of a ladder filter according to an embodiment.

Figure 6:
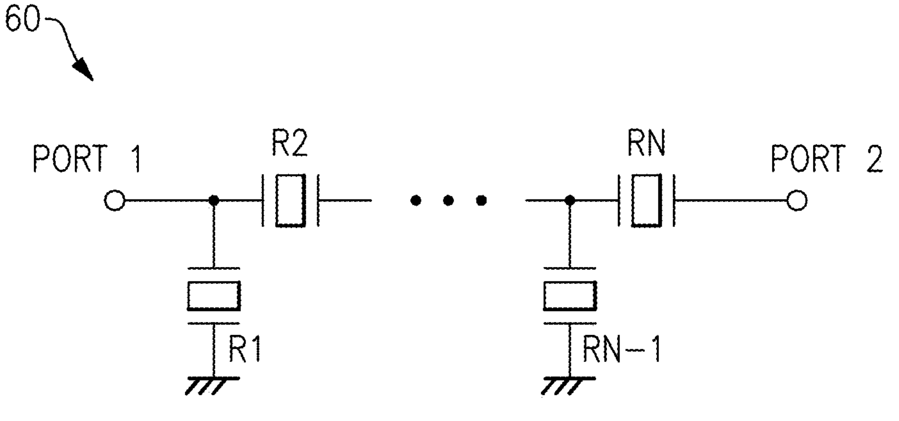

FIG. 6 is a schematic diagram of a ladder filter according to another embodiment.

Figure 7:
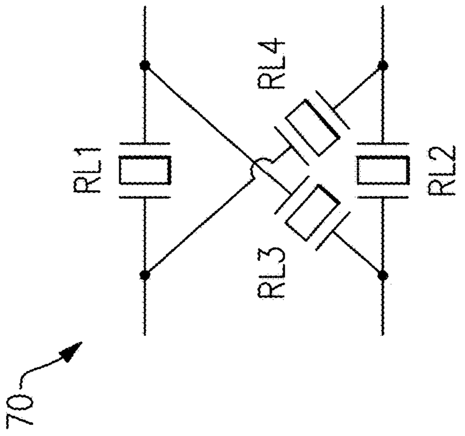

FIG. 7 is a schematic diagram of a lattice filter.

Figure 8:
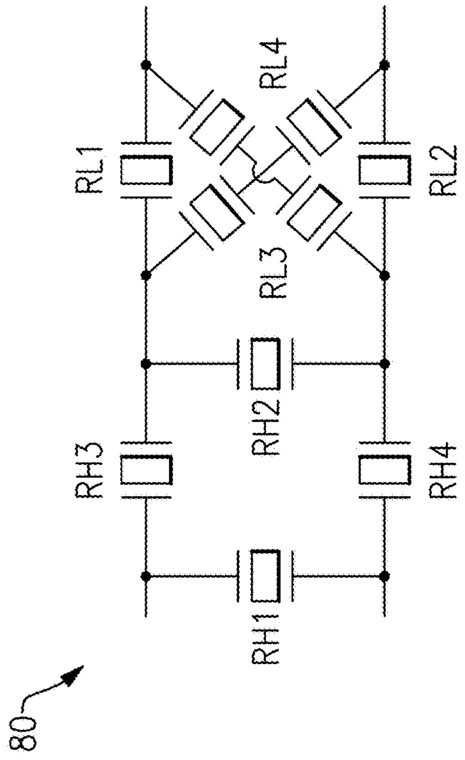

FIG. 8 is a schematic diagram of a hybrid ladder and lattice filter.

Figure 9:
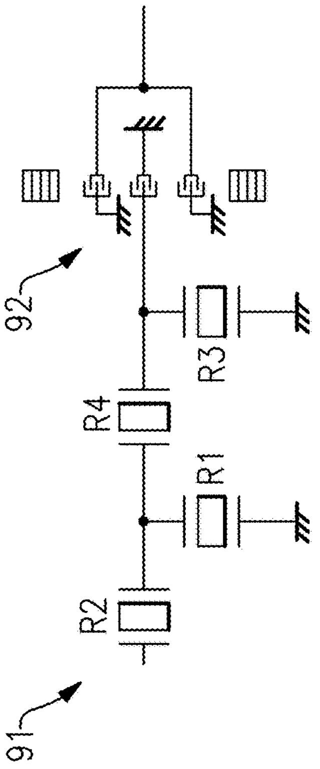

FIG. 9 is a schematic diagram of an acoustic filter that includes ladder stages and a multi-mode surface acoustic wave filter.

Figure 10A:
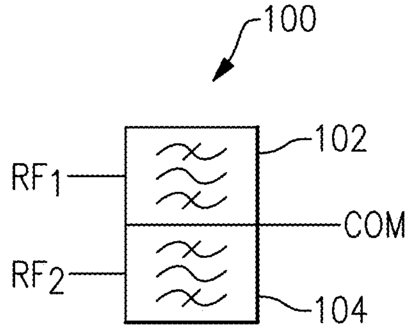

FIG. 10A is a schematic diagram of a duplexer that includes an acoustic wave filter according to an embodiment.

Figure 10B:
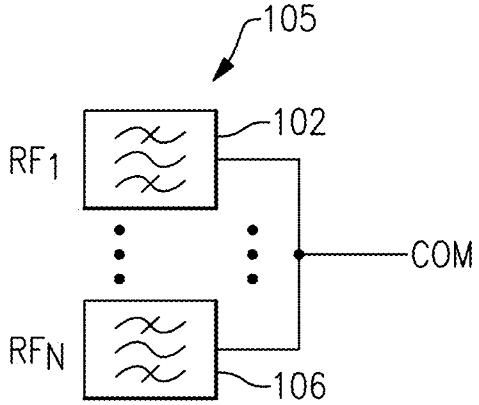

FIG. 10B is a schematic diagram of a multiplexer that includes an acoustic wave filter according to an embodiment.

Figure 11:
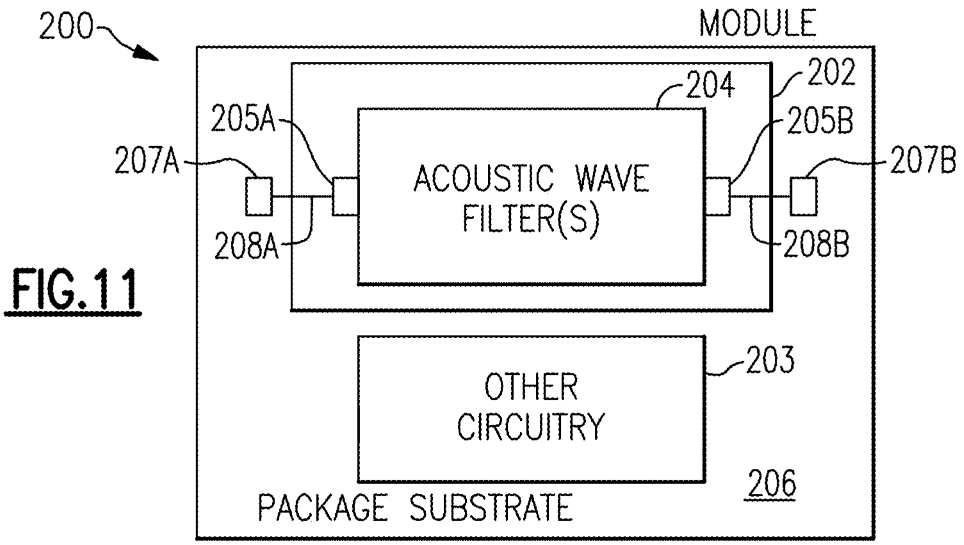

FIG. 11 is a schematic diagram of a radio frequency module that includes an acoustic wave filter according to an embodiment.

Figure 12:
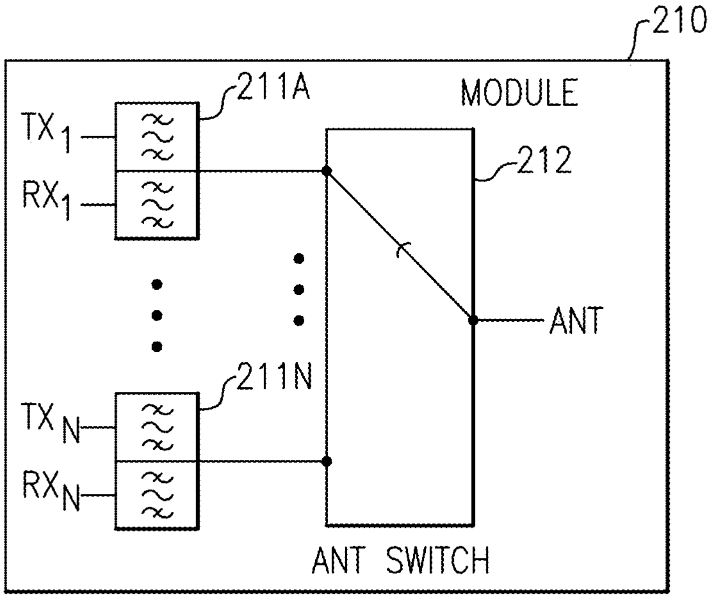

FIG. 12 is a schematic block diagram of a module that includes an antenna switch and duplexers according to an embodiment.

Figure 13:
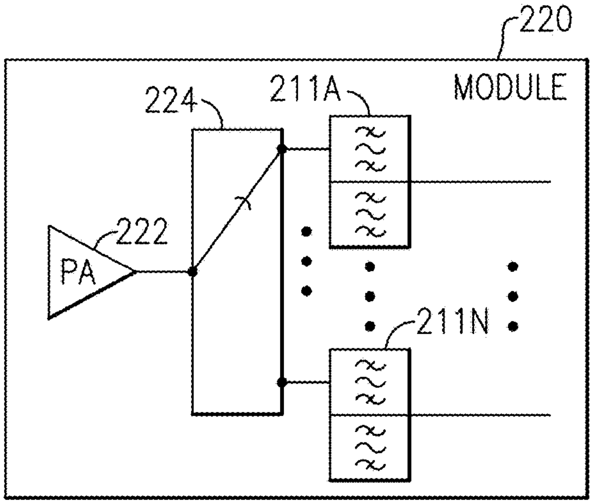

FIG. 13 is a schematic block diagram of a module that includes a power amplifier, a radio frequency switch, and duplexers according to an embodiment.

Figure 14:
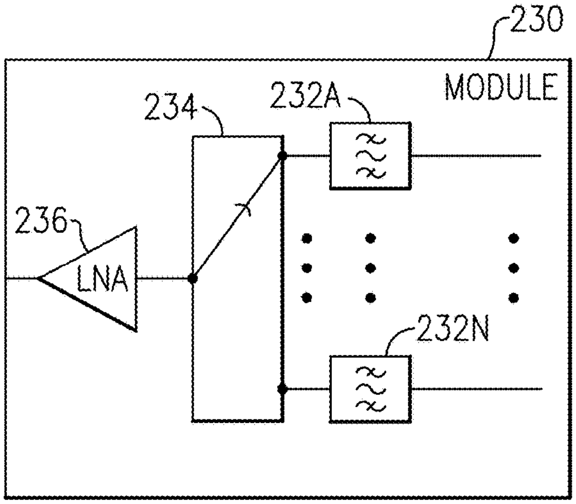

FIG. 14 is a schematic block diagram of a module that includes a low noise amplifier, a radio frequency switch, and filters according to an embodiment.

Figure 15:
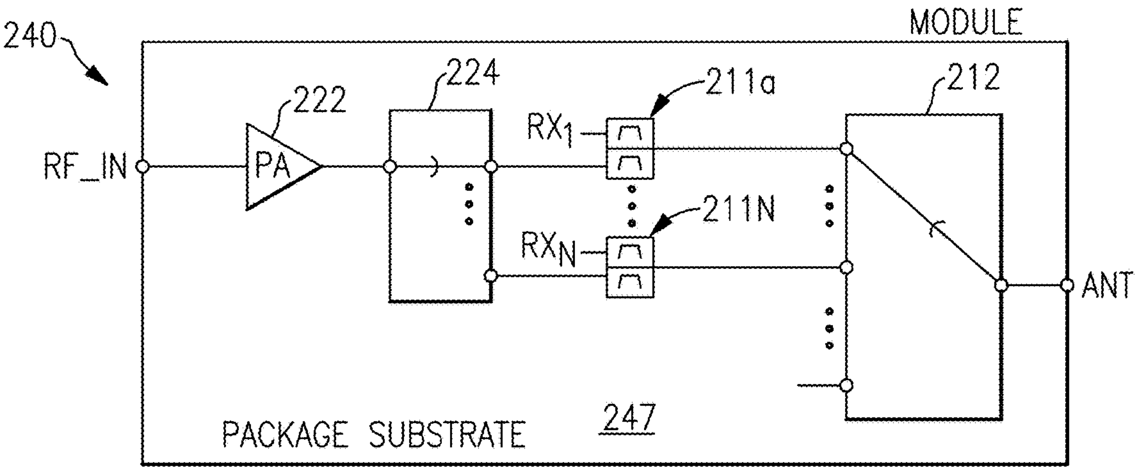

FIG. 15 is a schematic diagram of a radio frequency module that includes an acoustic wave filter according to an embodiment.

Figure 16A:
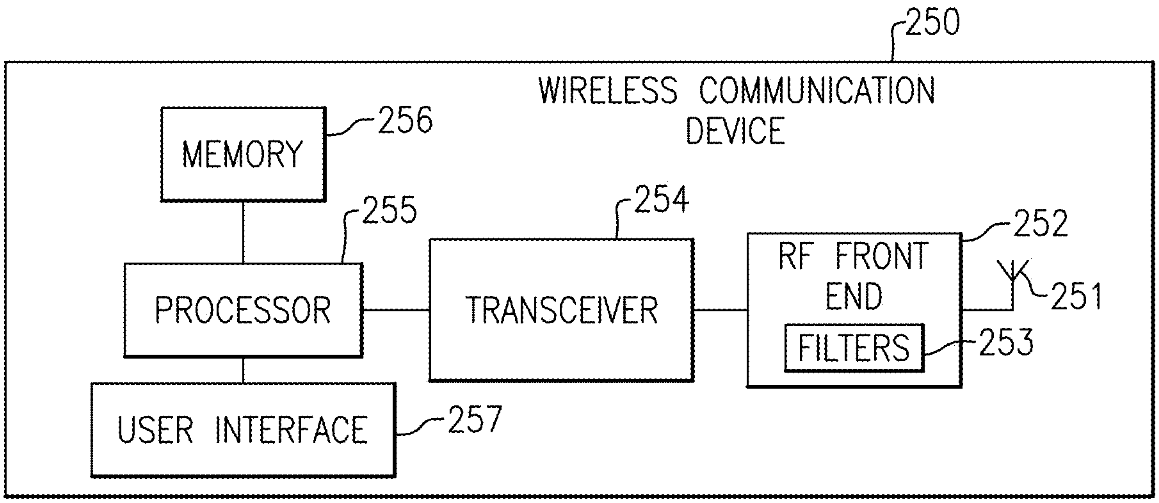

FIG. 16A is a schematic block diagram of a wireless communication device that includes an acoustic wave filter according to an embodiment.

Figure 16B:
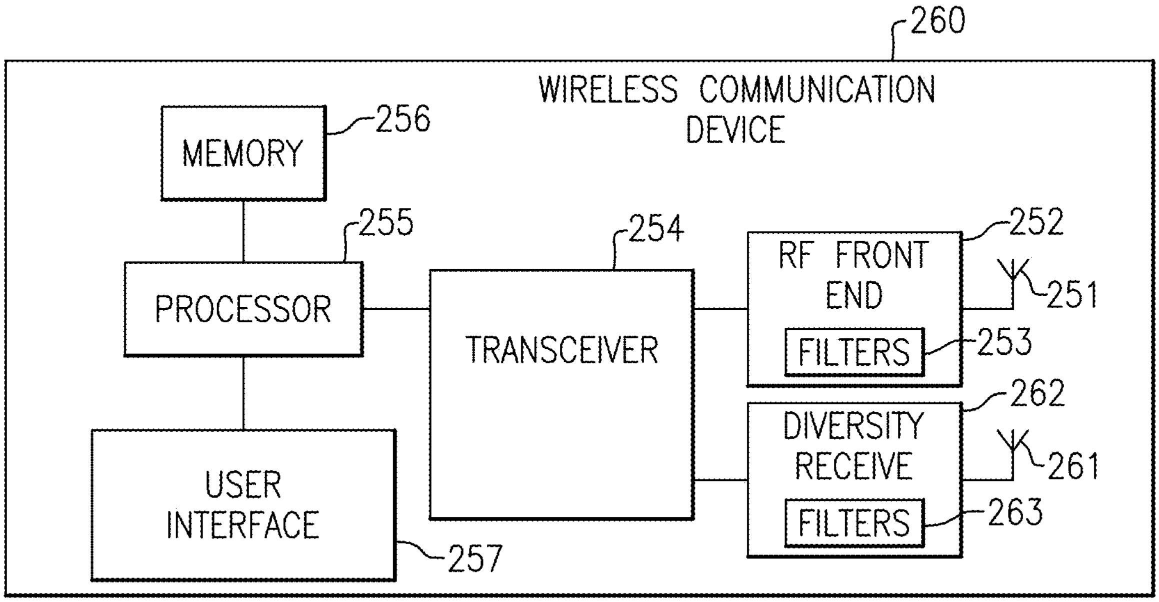

FIG. 16B is a schematic block diagram of another wireless communication device that includes an acoustic wave filter according to an embodiment.

DETAILED DESCRIPTION OF EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic filters can implement bandpass filters. For example, a bandpass filter can be formed from temperature compensated (TC) surface acoustic wave (SAW) resonators. As another example, a bandpass filter can be formed from bulk acoustic wave (BAW) resonators, such as film bulk acoustic wave resonators (FBARs).

In acoustic filter applications, insertion loss improvement is typically desired by customers. Insertion loss improvement can help a receive chain with achieve a desired noise figure. Insertion loss improvement can help with implementing a transmit chain with less power consumption and/or better power handling.

Typical lithium tantalate ($LiTaO_3$, LT) based MPS SAW filter packages have an upper limit for $$k_{eff}^2$$

of around 12%. This value is higher than the $$k_{eff}^2$$

for a 128° lithium niobate ($LiNbO_3$, LN) based MPS SAW filter package. However, $$k_{eff}^2$$

is still too small to obtain enough passband and good insertion loss. To obtain a $$k_{eff}^2$$

greater than 12%., a LN based MPS SAW filter package was proposed. Said LN based MPS had an attractive $$k_{eff}^2$$

greater than 15% but required a thick silicon dioxide ($SiO_2$) layer to compensate the LN's bad TCF likely resulting in a limited Q performance due to $SiO_2$ mechanical loss.

To provide a solution with a high $$k_{eff}^2$$

and a high Q, LT based MPS SAW filter packages with an embedded interdigital transducer (IDT) structure are proposed. Size reduction due to a large static capacitance may be achieved by embedding the IDT in a high permittivity piezo substrate. Q performance may be maintained without requiring thick $SiO_2$.

Aspects of this disclosure relate to implementing an acoustic wave filter from more than one type of acoustic resonator. In certain embodiments, an acoustic wave filter can include series TCSAW resonators and shunt BAW resonators. Series TCSAW resonators can achieve higher quality factor (Q) in a frequency range below a resonant frequency (fs), while shunt BAW resonators can achieve a higher Q in a frequency range between fs and an anti-resonant frequency (fp). TCSAW resonators and/or BAW resonators may also be implemented in a stacked configuration.

While example SAW devices will now be discussed, the devices and methods disclosed herein, including those relating to FIGS. 2A-2C', for example, can apply to other types of acoustic wave devices, including boundary wave devices and Lamb wave devices, for example.

Figure 1A:
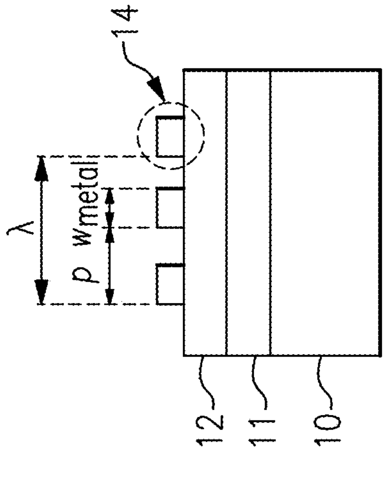
FIG. 1A is a cross sectional view of an IDT structure of a section of a SAW device having an IDT structure arranged on a piezoelectric layer.

FIG. 1A is a cross sectional view of an IDT structure 14 of a section of a SAW device having a IDT structure arranged on a piezoelectric layer 12. The SAW device can be a TCSAW resonator. As illustrated, the SAW device includes a piezoelectric layer 12 which may be formed over a functional layer 11, which can be made of silicon dioxide ($SiO_2$), for example, and interdigital transducer (IDT) electrodes 14. The $SiO_2$ layer may be formed on a support substrate 10. The TCSAW device may comprise a temperature compensation layer over the IDT electrodes 14.

The piezoelectric layer 12 can be a lithium based piezoelectric layer. For example, the piezoelectric layer 12 can be a lithium niobate (LN) layer. As another example, the piezoelectric layer 12 can be a lithium tantalate (LT) layer.

In the TCSAW device, the IDT electrode 14 is over the piezoelectric layer 12. As illustrated, the IDT electrode 14 has a first side in physical contact with the piezoelectric layer 12 and a second side which may be in physical contact with the TC layer (not shown). The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications. A ratio of the IDT width ($w_{metal}$) to the pitch (p) is usually defined as duty factor (DF) or metallization ratio ($w_{metal}/p$).

In the TCSAW device, the TC layer can bring a temperature coefficient of frequency (TCF) of the TCSAW device closer to zero. The TC layer can have a positive TCF. This can compensate for a negative TCF of the piezoelectric layer 12. The piezoelectric layer 12 can be lithium niobate or lithium tantalate, which both have a negative TCF. The TC layer can be a dielectric film. The TC layer can be a silicon dioxide ($SiO_2$) layer. In some other embodiments, a different TC layer can be implemented. Some examples of other TC layers include a tellurium dioxide ($TeO_2$) layer or a silicon oxyfluoride (SiOF) layer.

Figure 1B:
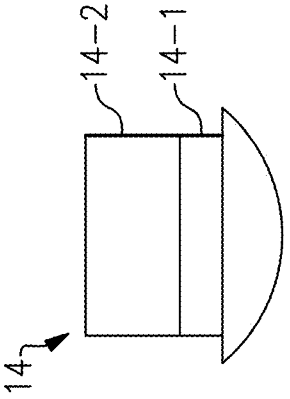
FIG. 1B is an enlarged view of the encircled portion of the IDT shown in FIG. 1A.

FIG. 1B is an enlarged view of the encircled portion of the IDT 14 shown in FIG. 1A. In the example shown in FIG. 1B, the IDT 14 has two layers, for instance a layer 14-1 of molybdenum (Mo), and a layer 14-2 of aluminum (Al). The IDT 14 as a whole is arranged on the piezoelectric layer 12.

Figure 1C:
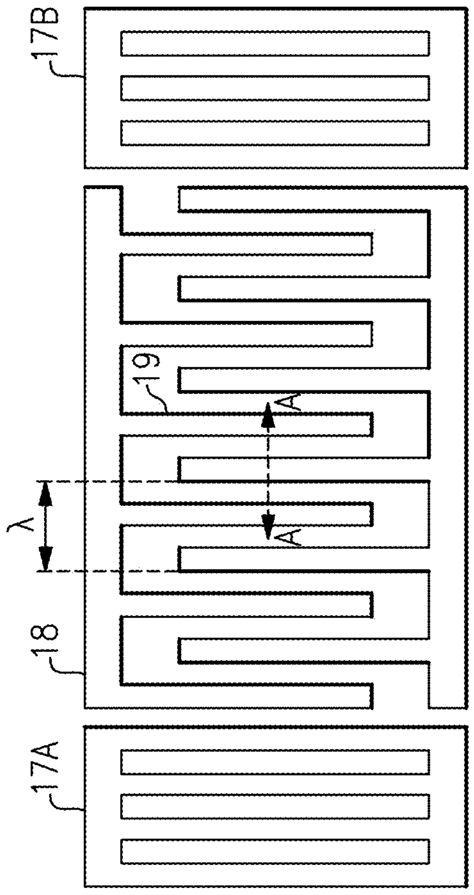
FIG. 1C is a top view on a SAW device having e.g. the IDT structure illustrated in FIG. 1A.

FIG. 1C is a top view on a SAW device having e.g. an IDT structure 14 illustrated in FIG. 1A. In FIG. 1C, the view of the SAW devices shown in FIG. 1A or FIG. 1B is along the dashed line from A to A. The TC layer is not shown in FIG. 1C. The IDT electrode 14 is positioned between a first acoustic reflector 17A and a second acoustic reflector 17B. The acoustic reflectors 17A and 17B are separated from the IDT electrode 14 by respective gaps. The IDT electrode 14 includes a bus bar 18 and IDT fingers 19 extending from the bus bar 18. The IDT fingers 19 have a pitch of $p=\lambda/2$, where $\lambda$ denotes the wavelength of the resonant frequency fs of the SAW device. The SAW device can include any suitable number of IDT fingers 19. The pitch of the IDT fingers 19 corresponds to the resonant frequency fs of the SAW device.

Figure 1D:
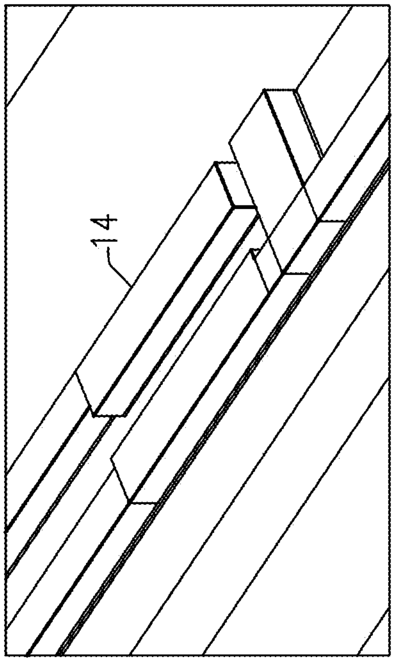
FIG. 1D is a perspective view on a section of an IDT structure of a SAW device such as the SAW device shown in FIG. 1C.

FIG. 1D is a perspective view on a section of a rectangular IDT structure 14 of a SAW device, such as a SAW device shown in FIG. 1C. The TC layer is not shown in FIG. 1D. A shown in FIG. 1D, a piston mode may be implemented as a hammerhead at end portions of the IDT structure 14.

FIG. 2A is a cross sectional view of an IDT structure of a section of a SAW device with a partially embedded IDT structure having two layers of Mo and Al or two layers of Cu and Al. The IDT structure may be multi-layered in some applications. Mo, Cu, and Al are merely mentioned as examples.

The SAW device partly shown in FIG. 2A may comprise a support substrate 10, a layer of silicon dioxide ($SiO_2$) 11 formed on the support substrate 10, a piezoelectric layer 12 formed on the layer of $SiO_2$, and the partially embedded IDT structure 14. The piezoelectric layer 12 may comprise 42° XY-$LiTaO_3$ (42° XY-LT) or consist thereof. Alternatively or additionally, the piezoelectric layer 12 may comprise αXY-LT, or consist thereof, where α denotes the LT cut angle. The LT cut angle α may be in the range $0° \leq \alpha \leq 50°$.

FIG. 2A' is an enlarged view of the encircled portion of the IDT 14 shown in FIG. 2A. As shown in FIG. 2A', in the case of two layers of Mo and Al, the layer of Mo has a height $h_{Mo}$, and the layer of Al has a height $h_{Al}$. The height $h_{Mo}$ of the Mo layer may be in the range $0.02 \leq h_{Mo}/\lambda \leq 0.08$, where A corresponds to the geometry described in FIG. 1. The wavelength $\lambda$ may be defined as the wavelength along an IDT propagation direction of a main mode. The main mode may be the mode that primally contributes to form the filter characteristics. The height $h_{Al}$ of the Al layer may be in the range $0.04 \leq h_{Al}/\lambda \leq 0.08$, where $\lambda$ is defined as above.

In the case of two layers of Cu and Al, the layer of Cu has a height $h_{Cu}$. The height $h_{Cu}$ of the Cu layer may be in the range $0.02 \leq h_{Cu}/\lambda \leq 0.08$, where $\lambda$ is defined as above. The height $h_{Al}$ of the Al layer may be in the range $0.04 \leq h_{Al}/\lambda \leq 0.08$, where $\lambda$ is defined as above. Cu can be used instead of Mo. Cu plating is suitable for embedding the IDT structure. Acoustic properties of Cu and Mo are similar.

The IDT structure 14 has an embedment depth $d_{embed}$. The embedment depth $d_{embed}$ in the piezoelectric layer 12 may be in the range $0.00 < d_{embed}/\lambda \leq 0.10$, where $\lambda$ is defined as above.

Figure 2B:
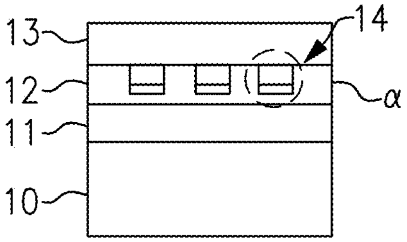
FIG. 2B is a cross sectional view of an IDT structure of a section of a SAW device with a fully embedded IDT structure having two layers of Mo and Al or two layers of Cu and Al where the fully embedded IDT structure is capped with a piezoelectric layer.
Figure 2B:
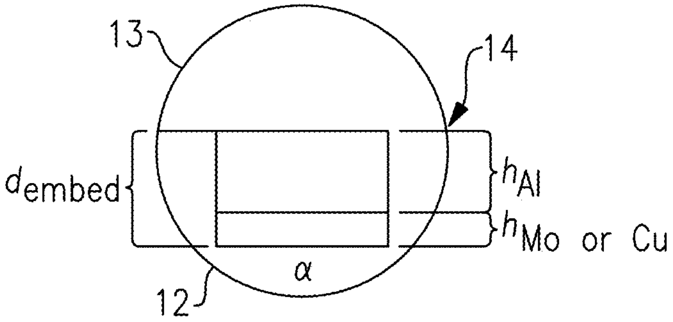

FIG. 2B is a cross sectional view of an IDT structure 14 of a section of a SAW device with a fully embedded IDT structure having two layers of Mo and Al or two layers of Cu and Al where the fully embedded IDT structure 14 is capped with a piezoelectric layer 13. Capping with a piezoelectric layer may increase a static capacitance which may be beneficial for size reduction.

The IDT structure 14 may be multi-layered in some applications. Mo, Cu, and Al are merely mentioned as examples.

The SAW device partly shown in FIG. 2B may comprise a support substrate a layer of silicon dioxide ($SiO_2$) 11 formed on the support substrate 10, a piezoelectric layer 12 formed on the layer of $SiO_2$ and comprising the fully embedded IDT structure 14, and the piezoelectric layer 13 capping the fully embedded IDT structure 14. The piezoelectric layer 12 and the piezoelectric layer 13 may comprise 42° XY-$LiTaO_3$ (42° XY-LT) or consist thereof. Alternatively or additionally, the piezoelectric layers 12 and 13 may comprise αXY-LT, or consist thereof, where α denotes the LT cut angle. The LT cut angle α may be in the range $0° \leq \alpha \leq 50°$. The LT cut angles of the piezoelectric layers 12 and 13 may also be different.

FIG. 2B' is an enlarged view of the encircled portion of the IDT 14 shown in FIG. 2B. As shown in FIG. 2B', in the case of two layers of Mo and Al, the layer of Mo has a height $h_{Mo}$, and the layer of Al has a height $h_{Al}$. The height $h_{Mo}$ of the Mo layer may be in the range $0.02 \leq h_{Mo}/\lambda \leq 0.08$, where $\lambda$ corresponds to the geometry described in FIG. 1. The wavelength $\lambda$ may be defined as the wavelength along an IDT propagation direction of a main mode. The main mode may be the mode that primally contributes to form the filter characteristics. The height $h_{Al}$ of the Al layer may be in the range $0.04 \leq h_{Al}/\lambda \leq 0.08$, where $\lambda$ is defined as above.

In the case of two layers of Cu and Al, the layer of Cu has a height $h_{Cu}$. The height $h_{Cu}$ of the Cu layer may be in the range $0.02 \leq h_{Cu}/\leq 0.08$, where $\lambda$ is defined as above. The height $h_{Al}$ of the Al layer may be in the range $0.04 \leq h_{Al}/\lambda \leq 0.08$, where $\lambda$ is defined as above.

For the fully embedded IDT structure the relation $d_{embed} = h_{Mo\ or\ Cu} + h_{Al}$ holds.

Figure 2C:
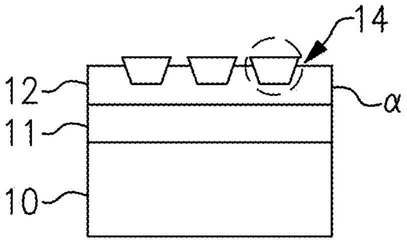
FIG. 2C is a cross sectional view of an IDT structure of a section of a SAW device with a partially embedded IDT structure having a layer of Cu, Pt, or Au where the IDT structure has a reverse tapered shape.
Figure 2C:
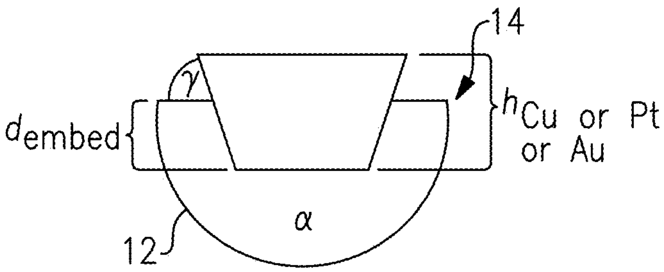

FIG. 2C is a cross sectional view of an IDT structure of a section of a SAW device with a partially embedded IDT structure 14 having a layer of Cu, Pt, or Au where the IDT structure 14 has a reverse tapered shape. The reverse tapered IDT structure 14 may be multi-layered in some applications. Cu, Pt, or Au are merely mentioned as examples.

The SAW device partly shown in FIG. 2C may comprise a support substrate 10, a layer of silicon dioxide ($SiO_2$) 11 formed on the support substrate 10, a piezoelectric layer 12 formed on the layer of $SiO_2$, and the partially embedded IDT structure 14. The piezoelectric layer 12 may comprise 42° XY-$LiTaO_3$ (42° XY-LT) or consist thereof. Alternatively or additionally, the piezoelectric layer 12 may comprise αXY-LT, or consist thereof, where a denotes the LT cut angle. The LT cut angle α may be in the range $0° \leq \alpha \leq 50°$.

FIG. 2C' is an enlarged view of the encircled portion of the IDT 14 shown in FIG. 2C. As shown in FIG. 2C', the layer of Cu, Pt, or Au has a height $h_{Cu\ or\ Pt\ or\ Au}$. The height $h_{Cu\ or\ Pt\ or\ Au}$ of the Cu, Pt, or Au layer may be in the range $0.06 \leq h_{Mo}/\lambda \leq 0.16$, where λ corresponds to the geometry described in FIG. 1. The wavelength λ may be defined as the wavelength along an IDT propagation direction of a main mode. The main mode may be the mode that primally contributes to form the filter characteristics.

The reverse tapered IDT structure 14 has an embedment depth $d_{embed}$. The embedment depth $d_{embed}$ in the piezoelectric layer 12 may be in the range $0.00 \leq d_{embed}/\lambda \leq 0.16$, where λ is defined as above. The reverse tapered IDT structure 14 may be fully embedded or formed in the piezoelectric layer 12. The SAW device partly shown in FIG. 2C may comprise a piezoelectric layer 13 (not shown in FIG. 2C and FIG. 2C') capping the fully embedded IDT structure 14.

The reverse tapered IDT structure 14 may have a reverse taper angle γ with respect to the surface of the piezoelectric layer 12. The reverse taper angle γ may be in the range $65° \leq \gamma < 90°$, preferably at 75°. Different sides of the reverse tapered IDT structure 14 may have different reverse taper angles.

The reverse tapered IDT structure 14 may be formed starting out from $SiO_2$ or a-Si deposition on LT layer. The resulting substrate may be dry etched to form the shape of the reverse tapered IDT structure. A seed layer may then be deposited, followed by electroplating and planarization. In case of a-Si, $XeF_2$ gas may be used to remove a-Si.

While example SAW devices have been discussed with respect to 2A-2C', aspects described with respect to the devices of FIGS. 2A-2C' can apply to other types of acoustic wave devices, including boundary wave devices and Lamb wave devices. For example, boundary wave or Lamb wave devices can have layered structures in the similar or same arrangement of any of FIGS. 2A-2C' and can have inter-digital transducers partially or fully formed in the piezo-electric layer.

FIG. 3A illustrates three plots of static coupling (left frame), $$k^2_{eff}$$

(middle frame), and resonance frequency fs (right frame) versus embedment depth $d_{embed}/\lambda$ for different heights $h_{Mo}$ of a Mo layer in the range $0.02 \leq h_{Mo}/\lambda \leq 0.08$, fixed height $h_{Al}$ of an Al layer at $h_{Al}/\lambda = 0.08$, and fixed LT cut angle for XY-$LiTaO_3$ at 42°, as obtained from a 2D simulation for the IDT structure presented in FIG. 2A and FIG. 2A'.

The left frame of FIG. 3A shows that embedding the IDT structure may lead to an increase of the static coupling of up to approximately 40% across the range of simulation. Hence, a size of the SAW device may be reduced. In the left frame of FIG. 3A, it can also be seen that the overall thickness of the IDT structure has little to no effect on the static coupling because the static coupling is essentially independent of the different heights $h_{Mo}$ of the Mo layer used for the simulation.

The middle frame of FIG. 3A shows that embedding the IDT structure may lead to increase of $$k^2_{eff}$$

and thus to SAW device having an increased performance. A pass band filter may, for instance, be widened.

The right frame of FIG. 3A shows that embedding the IDT structure may lead to increased frequency (velocity) of up to approximately 12% the across range of simulation.

FIG. 3B illustrates three plots of static coupling (left frame), $$k^2_{eff}$$

(middle frame), and resonance frequency fs (right frame) versus embedment depth $d_{embed}/\lambda$ for different heights $h_{Al}$ of an Al layer in the range $0.04 \leq h_{Al}/\lambda \leq 0.08$, a fixed height $h_{Mo}$ of a Mo layer at $h_{Mo}/\lambda = 0.02$, and fixed LT cut angle for XY-$LiTaO_3$ at 42°, as obtained from a 2D simulation for the IDT structure presented in FIG. 2A and FIG. 2A'.

The left frame of FIG. 3B shows that embedding the IDT structure may lead to an increase of the static coupling of up to approximately 40% across the range of simulation. Hence, a size of the SAW device may be reduced. In the left frame of FIG. 3B, it can also be seen that the overall thickness of the IDT structure has little to no effect on the static coupling because the static coupling is essentially independent of the different heights $h_{Al}$ of the Al layer used for the simulation.

The middle frame of FIG. 3B shows that embedding the IDT structure may lead to increase of $$k^2_{eff}$$

and thus to SAW device having an increased performance for as long as a threshold for the overall thickness of the IDT structure is not exceeded (note the regions in which the trace for $h_{Al}/\lambda = 0.08$ is lower than the trace for $h_{Al}/\lambda = 0.06$).

The right frame of FIG. 3B shows that embedding the IDT structure may lead to an increased frequency (velocity) where a thicker Al layer lowers the velocity. Hence, resistivity may be improved.

FIG. 3C illustrates a plot of $$k^2_{eff}$$

versus embedment the LT cut angle for XY-$LiTaO_3$ for different embedment depths $d_{embed}/\lambda$ in the range $0.00 \leq d_{embed}/\lambda \leq 0.08$, a fixed height $h_{Mo}$ of a Mo layer at $h_{Mo}/\lambda = 0.02$, and a fixed height $h_{Al}$ of an Al layer at $h_{Al}/\lambda$=0.04, as obtained from a 2D simulation for the IDT structure presented in FIG. 2A and FIG. 2A'.

As can be seen from FIG. 3C, with respect to embedment ($d_{embed}/\lambda$=0), $$k_{eff}^2$$

is increased for any embedment depth $d_{embed}/\lambda$ in the range of simulation for an LT cut angle α greater or equal than approximately 20°. As shown in FIG. 20, $$k_{eff}^2$$

above 13.0% was achieved for all simulated embedment depths for LT cut angles α greater or equal than approximately 10° and less than or equal to approximately 35°, and for all simulated embedment depths other than 0.00 for LT cut angles α greater or equal than approximately 10° and less than or equal to approximately 45°. Moreover, $$k_{eff}^2$$

above 14.0% was achieved for all simulated embedment depths for LT cut angles α greater or equal than approximately 20° and less than or equal to approximately 25°, and for all simulated embedment depths other than 0.00 for LT cut angles α greater or equal than approximately 20° and less than or equal to approximately 35°.

FIG. 4A is a plot of admittance Y(dB) versus frequency f (GHz) for IDT structures with different embedment depths $d_{embed}/\lambda$ (no embedment, half embedded, and fully embedded) as obtained from a 3D simulation for IDT structures in accordance with the structures shown in FIG. 2A and FIG. 2A'.

FIG. 4B is a plot of conduction G(dB) versus frequency f (GHz) for IDT structures with different embedment depths $d_{embed}/\lambda$ (no embedment, half embedded, and fully embedded) as obtained from a 3D simulation for IDT structures in accordance with the structures shown in FIG. 2A and FIG. 2A'.

FIG. 4C is a plot of the quality factor Q versus frequency f (GHz) for IDT structures with different embedment depths $d_{embed}/\lambda$ (no embedment, half embedded, and fully embedded) as obtained from a 3D simulation for IDT structures in accordance with the structures shown in FIG. 2A and FIG. 2A'.

As can be seen from FIG. 4A to FIG. 4C in combination with the 2D simulations shown in FIG. 3A to FIG. 3C, a half embedded IDT structure has a benefit in $$k_{eff}^2$$

and static capacitance. A fully embedded IDT structure degraded by radiation loss. A quality factor for a half embedded IDT structure is approximately the same as the quality factor without embedment.

FIG. 5 is a schematic diagram of a ladder filter 50 according to an embodiment. The ladder filter 50 includes shunt BAW resonators 52 and series TCSAW resonators 54 coupled between RF input/output ports Port1 and Port2. The ladder filter 50 is an example topology of a band pass filter formed from acoustic resonators. In a band pass filter with a ladder filter topology, the shunt resonators can have lower resonant frequencies than the series resonators. The ladder filter 50 can be arranged to filter an RF signal. As illustrated, the shunt BAW resonators include resonators R1, R3, R5, R7, and R9. The illustrated series TCSAW resonators 54 include resonators R2, R4, R6, R8, and R10. In particular, the TC SAW resonators 54 may be formed with features of any one or more of the IDTs shown in FIG. 2A to FIG. 2C'. The first RF input/output port Port1 can be a transmit port for a transmit filter or a receive port for a receive filter. The second RF input/output port Port2 can be an antenna port. Any suitable number of series acoustic resonators can be in included in a ladder filter. Any suitable number of shunt acoustic wave resonators can be included in a ladder filter.

FIG. 6 is a schematic diagram of a ladder filter 60 according to another embodiment. The ladder filter 60 includes a plurality of acoustic resonators R1, R2, . . . , RN-1, and RN arranged between a first input/output port PORT1 and a second input/output port PORT1. One of the input/output ports PORT1 or PORT2 can be an antenna port. In certain instances, the other of the input/output ports PORT1 or PORT2 can be a receive port. In some other instances, the other of the input/output ports PORT1 or PORT2 can be a transmit port.

The ladder filter 60 illustrates that any suable number of ladder stages can be implemented in a ladder filter in accordance with any suitable principles and advantages disclosed herein. Ladder stages can start with a series resonator or a shunt resonator from any input/output port of the ladder filter 60 as suitable. As illustrated, the first ladder stage from the input/output port PORT1 begins with a shunt resonator R1. As also illustrated, the first ladder stage from the input/output port PORT2 begins with a series resonator RN.

The ladder filter 60 includes shunt resonators R1 and RN-1 and series resonator R2 and RN. The series resonators of the ladder filter 60 including resonators R2 and RN can be acoustic resonators of a first type that have higher Q than series resonators of a second type in a frequency range below fs. The shunt resonators of the ladder filter 60 including resonators R1 and RN-1 can be acoustic resonators of the second type and have higher Q than shunt resonators of the first type in a frequency range between fs and fp. This can lead to a reduced insertion loss. The ladder filter 60 can be a band pass filter with series resonators of the first type and shunt resonators of the second type. In some other embodiments, the series resonators of the ladder filter 60 including resonators R2 and RN can be acoustic resonators of the second type and the shunt resonators of the ladder filter 60 including resonators R1 and RN-1 can be acoustic resonators of the first type. In such embodiments, the ladder filter 60 can be a band pass filter.

The resonators of the first type can be TCSAW resonators and the resonators of the second type can be BAW resonators. Accordingly, the ladder filter 60 can include series TCSAW resonators and shunt BAW resonators in certain embodiments. Such BAW resonators can include FBARs and/or solidly mounted resonators (SMRs). In particular, the TCSAW resonators of the ladder filter 60 may be formed with features of any one or more of the IDTs shown in FIG. 2A to FIG. 2C'.

The resonators of the first type can be multi-layer piezoelectric substrate (MPS) SAW resonators and the resonators of the second type can be BAW resonators. Accordingly, the ladder filter 60 can include series MPS SAW resonators and shunt BAW resonators. Such BAW resonators can include FBARs and/or SMRs in certain embodiments.

The resonators of the first type can be non-temperature compensated SAW resonators and the resonators of the second type can be BAW resonators. Accordingly, the ladder filter 60 can include series non-temperature compensated SAW resonators and shunt BAW resonators in certain embodiments. Such BAW resonators can include FBARs and/or SMRs.

In a bandpass filter with a ladder filter topology, such as the acoustic wave filter 60, the shunt resonators can have lower resonant frequencies than the series resonators. In certain embodiments, the shunt resonators of the acoustic wave filter 60 are BAW resonators and the series resonators of the acoustic wave filter 60 are TCSAW resonators. In such embodiments, the acoustic wave filter 60 can be a band pass filter. Such a bandpass filter can achieve low insertion loss at both a lower band edge and an upper band edge of a passband.

In a band stop filter with a ladder filter topology, such as acoustic wave filter 60, the shunt resonators can have higher resonant frequencies than the series resonators. In certain embodiments, the acoustic wave filter 60 is a band stop filter, the shunt resonators of the acoustic wave filter 60 are TCSAW resonators and the series resonators of the acoustic wave filter 60 are BAW resonators. Such a band stop filter can achieve desirable characteristics in a stop band of the band stop filter.

In some applications of an acoustic wave filter that includes TCSAW series resonators and BAW shunt resonators, such as a transmit filter with a relatively high power handling specification, one or more series resonators close to a transmit port (or the lower frequency series resonators) can be BAW resonators to help with ruggedness.

In certain applications, the ladder filter 60 can be included in a multiplexer in which relatively high γ for the ladder filter 60 in one or more higher frequency carrier aggregation bands is desired. In such applications, an acoustic filter can include shunt resonators of the shunt type and an acoustic resonator of the second type can be included as a series resonator by which other series resonators of the first type are coupled to a common port of the multiplexer. This can increase γ of the ladder filter 60 in the one or more higher frequency carrier aggregation bands. For example, in applications where the second input/output port PORT2 is a common port of a multiplexer, the series resonator RN can be a BAW resonator, other series resonators of the ladder filter 60 can be TCSAW resonators, and the shunt resonators R1 and RN-1 can be BAW resonators. By having the series resonator RN closest to the common node be a BAW resonator instead of a TCSAW resonator, γ can be increased for the ladder filter 60 in one or more higher frequency carrier aggregation bands in such applications.

In some applications, the ladder filter 60 can be a transmit filter. In such applications, an acoustic resonator of the second type can be included as a series resonator by which other series resonators of the first type are coupled to a transmit port of the transmit filter. For example, in applications where the second input/output port PORT2 is a transmit port of a transmit filter, the series resonator RN can be a BAW resonator, other series resonators of the ladder filter 60 can be TCSAW resonators, and the shunt resonators R1 and RN-1 can be BAW resonators.

In certain applications, the ladder filter 60 can include more than two types of acoustic resonators. In such applications, the majority of the series resonators can be acoustic resonators of the first type (e.g., TCSAW resonators) and the majority of shunt resonators can be resonators of the second type (e.g., BAW resonators). The ladder filter 60 can include a third type of resonator as a shunt resonator and/or as a series resonator in such applications. The third type of resonator can be a Lamb wave resonator, for example. The acoustic wave filter 60 can include a plurality series resonators including temperature compensated surface acoustic wave resonators and a plurality shunt resonators including a Lamb wave resonator arranged as shunt resonator. The acoustic wave filter 60 can include a plurality of series resonators including a Lamb wave resonator and a plurality shunt resonators including bulk acoustic wave resonators arranged as shunt resonators.

FIG. 7 is a schematic diagram of a lattice filter 70. The lattice filter 70 is an example topology of a band pass filter formed from acoustic wave resonators. The lattice filter 60 can be arranged to filter an RF signal. As illustrated, the lattice filter 70 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 70 has a balanced input and a balanced output. The lattice filter 70 can be implemented with different type of acoustic resonators in accordance with any suitable principles and advantages disclosed herein. For example, the series resonators RL1 and RL2 can be TCSAW resonators and the shunt resonators RL3 and RL4 can be BAW resonators for a bandpass filter. In particular, the TC SAW resonators may be formed with features of any one or more of the IDTs shown in FIG. 2A to FIG. 2C'.

FIG. 8 is a schematic diagram of a hybrid ladder and lattice filter 80. The illustrated hybrid ladder and lattice filter includes series acoustic resonators RL1, RL2, RH3, and RH4 and shunt acoustic resonators RL3, RL4, RH1, and RH2. The hybrid ladder and lattice filter 80 can be implemented with different type of acoustic resonators in accordance with any suitable principles and advantages disclosed herein. For example, the series resonators RL1, RL2, RH3, and RH4 can be TCSAW resonators and the shunt resonators RL3, RL4, RH1, and RH2 can be BAW resonators for a bandpass filter. In particular, the TCSAW resonators may be formed with features of any one or more of the IDTs shown in FIG. 2A to FIG. 2C'.

FIG. 9 is a schematic diagram of an acoustic filter 91 that includes ladder stages and a multi-mode surface acoustic wave filter 92. The illustrated acoustic filter 91 includes series resonators R2 and R4, shunt resonators R1 and R3, and multi-mode surface acoustic wave filter 92. The filter 91 can be a receive filter. The multi-mode surface acoustic wave filter 92 can be connected to a receive port. The multi-mode surface acoustic wave filter 92 includes longitudinally coupled IDT electrodes. The multi-mode surface acoustic wave filter 92 can include a temperature compensation layer over longitudinally coupled IDT electrodes in certain applications. The series resonators R2 and R4 can be TCSAW resonators and the shunt resonators R1 and R3 can be BAW resonators for a bandpass filter. The shunt resonators R1 and R3 being BAW resonators can help with lower skirt steepness and insertion loss. In particular, the TCSAW resonators may be formed with features of any one or more of the IDTs shown in FIG. 2A to FIG. 2C'.

Acoustic filters disclosed herein include more than one type of acoustic wave resonator. Such filters can be implemented on a plurality of acoustic filter die. The plurality of acoustic filter die can be stacked and co-packaged with each other in certain applications.

FIG. 10A is a schematic diagram of a duplexer 100 that includes an acoustic wave filter according to an embodiment. The duplexer 100 includes a first filter 102 and a second filter 104 coupled to together at a common node COM. One of the filters of the duplexer 100 can be a transmit filter and the other of the filters of the duplexer 100 can be a receive filter. The transmit filter and/or the receive filter can be respective ladder filters with acoustic wave resonators having a topology similar to the ladder filter 50 of FIG. 5 and the ladder filter of FIG. 6. In some other instances, such as in a diversity receive application, the duplexer 100 can include two receive filters. The common node COM can be an antenna node.

The first filter 102 is an acoustic wave filter arranged to filter a radio frequency signal. The first filter 102 can include acoustic wave resonators coupled between a first radio frequency node RF1 and the common node. The first radio frequency node RF1 can be a transmit node or a receive node. The first filter 102 includes two types of acoustic resonators in accordance with any suitable principles and advantages disclosed herein.

The second filter 104 can be any suitable filter arranged to filter a second radio frequency signal. The second filter 104 can be, for example, an acoustic wave filter, an acoustic wave filter that includes two types of acoustic resonators, an LC filter, a hybrid acoustic wave LC filter, or the like. The second filter 104 is coupled between a second radio frequency node RF2 and the common node. The second radio frequency node RF2 can be a transmit node or a receive node.

Although example embodiments may be discussed with filters or duplexers for illustrative purposes, any suitable the principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include an acoustic wave filter including two types of acoustic resonators in accordance with any suitable principles and advantages disclosed herein.

FIG. 10B is a schematic diagram of a multiplexer 105 that includes an acoustic wave filter according to an embodiment. The multiplexer 105 includes a plurality of filters 102 to 106 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 102 is an acoustic wave filter arranged to filter a radio frequency signal. The first filter 102 can include acoustic wave resonators coupled between a first radio frequency node RF1 and the common node. The first radio frequency node RF1 can be a transmit node or a receive node. The first filter 102 includes two types of acoustic resonators in accordance with any suitable principles and advantages disclosed herein. The other filter(s) of the multiplexer 105 can include one or more acoustic wave filters, one or more acoustic wave filters that include two types of acoustic resonators in accordance with any suitable principles and advantages disclosed herein, one or more LC filters, one or more hybrid acoustic wave LC filters, or any suitable combination thereof.

The acoustic wave filters disclosed herein can be implemented in a variety of packaged modules. In particular, acoustic wave filters disclosed herein may be formed with features of any one or more of the IDTs shown in FIG. 2A to FIG. 2C'. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 20 to 24 are schematic block diagrams of illustrative packaged modules according to certain embodiments. Any suitable combination of features of these packaged modules can be implemented with each other. While duplexers are illustrated in the example packaged modules of FIGS. 21, 22, and 24, any other suitable multiplexer that includes a plurality of filters coupled to a common node and/or standalone filter can be implemented instead of one or more duplexers. For example, a triplexer can be implemented in certain applications. As another example, one or more filters of a packaged module can be arranged as a transmit filter or a receive filter that is not included in a multiplexer.

FIG. 11 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more acoustic wave filters in accordance with any suitable combination of features of the acoustic wave filters disclosed herein. The acoustic wave component 202 can include an acoustic wave filter with series TCSAW resonators and shunt BAW resonators, for example.

The acoustic wave component 202 shown in FIG. 11 includes one or more acoustic wave filters 204 and terminals 205A and 205B. The one or more acoustic wave filters 204 includes an acoustic wave filter implemented in accordance with any suitable principles and advantages disclosed herein. The terminals 205A and 204B can serve, for example, as an input contact and an output contact. Although two terminals are illustrated, any suitable number of terminals can be implemented for a particular application. The acoustic wave component 202 and the other circuitry 203 are on a common packaging substrate 206 in FIG. 11. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 203 can be electrically connected to the one or more acoustic wave filters 204. The radio frequency module 200 can include one or more packaging structures to, for example, provide protection and/or facilitate easier handling of the radio frequency module 200. Such a packaging structure can include an overmold structure formed over the packaging substrate 206. The overmold structure can encapsulate some or all of the components of the radio frequency module 200.

FIG. 12 is a schematic block diagram of a module 210 that includes duplexers 211A to 211N and an antenna switch 212. One or more filters of the duplexers 211A to 211N can include an acoustic wave filter in accordance with any suitable principles and advantages disclosed herein. Any suitable number of duplexers 211A to 211N can be implemented. The antenna switch 212 can have a number of throws corresponding to the number of duplexers 211A to 211N. The antenna switch 212 can include one or more additional throws coupled to one or more filters external to the module 210 and/or coupled to other circuitry. The antenna switch 212 can electrically couple a selected duplexer to an antenna port of the module 210.

FIG. 13 is a schematic block diagram of a module 220 that includes a power amplifier 222, a radio frequency switch 224, and duplexers 211A to 211N according to an embodiment. The power amplifier 222 can amplify a radio frequency signal. The radio frequency switch 224 can be a multi-throw radio frequency switch. The radio frequency switch 224 can electrically couple an output of the power amplifier 222 to a selected transmit filter of the duplexers 211A to 211N. One or more filters of the duplexers 211A to 211N can be an acoustic wave filter in accordance with any suitable principles and advantages disclosed herein. Any suitable number of duplexers 211A to 211N can be implemented.

FIG. 14 is a schematic block diagram of a module 230 that includes filters 232A to 232N, a radio frequency switch 234, and a low noise amplifier 236 according to an embodiment. One or more filters of the filters 232A to 232N can include any suitable number of acoustic wave filters in accordance with any suitable principles and advantages disclosed herein. Any suitable number of filters 232A to 232N can be implemented. The illustrated filters 232A to 232N are receive filters. In some embodiments (not illustrated), one or more of the filters 232A to 232N can be included in a multiplexer that also includes a transmit filter. The radio frequency switch 234 can be a multi-throw radio frequency switch. The radio frequency switch 234 can electrically couple an output of a selected filter of filters 232A to 232N to the low noise amplifier 236. In some embodiments (not illustrated), a plurality of low noise amplifiers can be implemented. The module 230 can include diversity receive features in certain applications.

FIG. 15 is a schematic diagram of a radio frequency module 240 that includes an acoustic wave filter according to an embodiment. As illustrated, the radio frequency module 240 includes duplexers 211A to 211N, a power amplifier 222, a select switch 224, and an antenna switch 212. The radio frequency module 240 can include a package that encloses the illustrated elements. The illustrated elements can be disposed on a common packaging substrate 247. The packaging substrate 247 can be a laminate substrate, for example. A radio frequency module that includes a power amplifier can be referred to as a power amplifier module. A radio frequency module can include a subset of the elements illustrated in FIG. 15 and/or additional elements. The radio frequency module 240 may include any one of the acoustic wave filters in accordance with any suitable principles and advantages disclosed herein.

The duplexers 211A to 211N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave filter in accordance with any suitable principles and advantages disclosed herein. Similarly, one or more of the receive filters can include an acoustic wave filter in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 222 can amplify a radio frequency signal. The illustrated switch 224 is a multi-throw radio frequency switch. The switch 224 can electrically couple an output of the power amplifier 222 to a selected transmit filter of the transmit filters of the duplexers 211A to 211N. In some instances, the switch 224 can electrically connect the output of the power amplifier 222 to more than one of the transmit filters. The antenna switch 212 can selectively couple a signal from one or more of the duplexers 211A to 211N to an antenna port ANT. The duplexers 211A to 211N can be associated with different frequency bands and/or different modes of operation (e.g., different power modes, different signaling modes, etc.).

The acoustic wave filters disclosed herein can be implemented in a variety of wireless communication devices. FIG. 16A is a schematic diagram of a wireless communication 250 device that includes filters 253 in a radio frequency front end 252 according to an embodiment. One or more of the filters 253 can be acoustic wave filter in accordance with any suitable principles and advantages disclosed herein. The wireless communication device 250 can be any suitable wireless communication device. For instance, a wireless communication device 250 can be a mobile phone, such as a smart phone. As illustrated, the wireless communication device 250 includes an antenna 251, an RF front end 252, a transceiver 254, a processor 255, a memory 256, and a user interface 257. The antenna 251 can transmit RF signals provided by the RF front end 252. Such RF signals can include carrier aggregation signals. The antenna 251 can receive RF signals and provide the received RF signals to the RF front end 252 for processing. Such RF signals can include carrier aggregation signals. The wireless communication device 250 can include two or more antennas in certain instances.

The RF front end 252 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 252 can transmit and receive RF signals associated with any suitable communication standards. One or more of the filters 253 can include an acoustic wave filter with two types of acoustic resonators that includes any suitable combination of features of the embodiments disclosed above.

The transceiver 254 can provide RF signals to the RF front end 252 for amplification and/or other processing. The transceiver 254 can also process an RF signal provided by a low noise amplifier of the RF front end 252. The transceiver 254 is in communication with the processor 255. The processor 255 can be a baseband processor. The processor 255 can provide any suitable base band processing functions for the wireless communication device 250. The memory 256 can be accessed by the processor 255. The memory 256 can store any suitable data for the wireless communication device 250. The user interface 257 can be any suitable user interface, such as a display with touch screen capabilities.

FIG. 16B is a schematic diagram of a wireless communication device 260 that includes filters 253 in a radio frequency front end 252 and second filters 263 in a diversity receive module 262. The wireless communication device 260 is like the wireless communication device 250 of FIG. 16A, except that the wireless communication device 260 also includes diversity receive features. As illustrated in FIG. 16B, the wireless communication device 260 includes a diversity antenna 261, a diversity module 262 configured to process signals received by the diversity antenna 261 and including filters 263, and a transceiver 254 in communication with both the radio frequency front end 252 and the diversity receive module 262. One or more of the second filters 263 can include an acoustic wave filter in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

An acoustic wave filter including any suitable combination of features disclosed herein be arranged to filter a radio frequency signal in a 5GNR operating band within Frequency Range 1 (FR1). A filter arranged to filter a radio frequency signal in a 5G NR operating band can include two types of acoustic resonators in accordance with any principles and advantages disclosed herein. FR1 can be from 410 MHz to 7.125 GHz, for example, as specified in a current 5G NR specification. In 5G applications, an acoustic wave filter with a relatively wide pass band and relatively low insertion loss can be advantageous for implementing dual connectivity. An acoustic wave filter in accordance with any suitable principles and advantages disclosed herein can be arranged to filter a radio frequency signal in a 4G LTE operating band and/or in a filter having a passband that includes a 4G LTE operating band and a 5G NR operating band. Filters disclosed herein can filter radio frequency signals in a frequency range from about 400 MHz to 3 GHz in certain applications.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A radio frequency acoustic filter comprising:

an input terminal configured to receive a radio frequency signal;

an output terminal;

a plurality of resonators between the input terminal and the output terminal, the plurality of resonators arranged to filter the radio frequency signal; and at least one resonator of the plurality of resonators including a support substrate, a functional layer, and a piezoelectric layer, both the piezoelectric layer and the functional layer supported by the support substrate, and a multi-layer interdigital transducer structure partially formed in the piezoelectric layer, the functional layer between the piezoelectric layer and the support substrate, and a second piezoelectric layer directly over and capping the multi-layer interdigital transducer structure to increase a static capacitance, the multi-layer interdigital transducer structure having a reverse tapered shape with tapering extending from a bottom to a top of the multi-layer interdigital transducer structure, a reverse taper angle of the multi-layer interdigital transducer structure with respect to a top surface of the piezoelectric layer being greater than or equal to 65° and less than 90°.

2. The radio frequency acoustic filter of claim 1 wherein the multi-layer interdigital transducer structure has an embedment depth $d_{embed}$ in a range between 0.01λ and 0.10λ, where λ is a wavelength along an interdigital transducer propagation direction of a main mode.

3. The radio frequency acoustic filter of claim 2 wherein the piezoelectric layer includes lithium tantalate ($LiTaO_3$, LT) with a LT cut angle α for XY-$LiTaO_3$, where α is equal or larger than approximately 20° and 360° is a full rotation.

4. The radio frequency acoustic filter of claim 3 wherein the multi-layer interdigital transducer structure includes a first layer of molybdenum (Mo) has a height $h_{Mo}$ in a range between 0.02λ and 0.08λ, where λ is a wavelength along an interdigital transducer propagation direction of a main mode.

5. The radio frequency acoustic filter of claim 4 wherein the multi-layer interdigital transducer structure includes a second layer of aluminum (Al) has a height $h_{Al}$ in a range between 0.04λ and 0.08λ, where λ is a wavelength along an interdigital transducer propagation direction of a main mode.

6. The radio frequency acoustic filter of claim 3 wherein the LT cut angle α is equal or larger than approximately 20° and less than or equal to 50°.

7. A mobile device comprising an antenna and a radio frequency front end module coupled to the antenna, the radio frequency front end module including the radio frequency acoustic filter of claim 1.

8. The radio frequency acoustic filter of claim 1 wherein the plurality of resonators is arranged as a ladder filter.

9. An acoustic wave device comprising:
- a support substrate;
- a piezoelectric layer supported by the support substrate;
- a functional layer between the piezoelectric layer and the support substrate;
- a multi-layer interdigital transducer structure partially formed in the piezoelectric layer, the multi-layer interdigital transducer structure having an embedment depth $d_{embed}$ in a range between 0.01λ and 0.10λ, where λ is a wavelength along an interdigital transducer propagation direction of a main mode; and
- a second piezoelectric layer directly over and capping the multi-layer interdigital transducer structure to increase a static capacitance, the multi-layer interdigital transducer structure having a reverse tapered shape with tapering extending from a bottom to a top of the multi-layer interdigital transducer structure, a reverse taper angle of the multi-layer interdigital transducer structure with respect to a top surface of the piezoelectric layer being greater than or equal to 65° and less than 90°.

10. The acoustic wave device of claim 9 wherein the piezoelectric layer includes lithium tantalate ($LiTaO_3$, LT) with a LT cut angle α for XY-$LiTaO_3$, where a is equal or larger than approximately 20° and 360° is a full rotation.

11. The acoustic wave device of claim 10 wherein the multi-layer interdigital transducer structure includes a first layer of molybdenum (Mo) having a height $h_{Mo}$ in a range between 0.02λ and 0.08λ, where λ is a wavelength along an interdigital transducer propagation direction of a main mode.

12. The acoustic wave device of claim 11 wherein the multi-layer interdigital transducer structure includes a second layer of aluminum (Al) has a height $h_{Al}$ in a range between 0.04λ and 0.08λ, where λ is a wavelength along an interdigital transducer propagation direction of a main mode.

13. The acoustic wave device of claim 10 wherein the LT cut angle α is equal or larger than approximately 20° and less than or equal to 50°.

14. The acoustic wave device of claim 9 wherein the multi-layer interdigital transducer structure has an embedment depth $d_{embed}$ in a range between 0.01λ and 0.10λ, where λ is a wavelength along an interdigital transducer propagation direction of a main mode.

15. A method of forming an acoustic wave device comprising:
- forming a substrate;
- forming a functional layer on the substrate;
- forming a piezoelectric layer directly on the functional layer; and
- forming a multi-layer interdigital transducer structure partially embedded in the piezoelectric layer by applying an $SiO_2$ or a-Si deposition on the piezoelectric layer and dry etching the resulting substrate to form the multi-layer interdigital transducer structure with a reverse tapered shape, depositing a seed layer, and, following deposition of the seed layer, electroplating and planarizing, the multi-layer interdigital transducer structure having a reverse tapered shape with tapering extending from a bottom to a top of the multi-layer interdigital transducer structure, a reverse taper angle of the multi-layer interdigital transducer structure with respect to a top surface of the piezoelectric layer being greater than or equal to 65° and less than 90°; and
- forming a second piezoelectric layer directly over and capping the multi-layer interdigital transducer structure to increase a static capacitance.

16. The method of claim 15 wherein the multi-layer interdigital transducer structure has an embedment depth $d_{embed}$ in a range between 0.01λ and 0.10λ, where λ is a wavelength along an interdigital transducer propagation direction of a main mode.

17. The method of claim 16 wherein the piezoelectric layer includes lithium tantalate ($LiTaO_3$, LT) with a LT cut angle α for XY-$LiTaO_3$, where α is equal or larger than approximately 20° and 360° is a full rotation.

18. The method of claim 17 wherein the multi-layer interdigital transducer structure includes a first layer of molybdenum (Mo) has a height $h_{Mo}$ in a range between 0.02λ and 0.08λ, where λ is a wavelength along an interdigital transducer propagation direction of a main mode.

19. The method of claim 18 wherein the multi-layer interdigital transducer structure includes a second layer of aluminum (Al) has a height $h_{Al}$ in a range between 0.04λ and 0.08λ, where λ is a wavelength along an interdigital transducer propagation direction of a main mode.

20. The method of claim 17 wherein the LT cut angle α is equal or larger than approximately 20° and less than or equal to 50°.

* * * * *